United States Patent
Anton et al.

(10) Patent No.: US 10,900,116 B2
(45) Date of Patent: *Jan. 26, 2021

(54) PVD SYSTEM WITH REMOTE ARC DISCHARGE PLASMA ASSISTED PROCESS

(71) Applicant: VAPOR TECHNOLOGIES, INC., Longmont, CO (US)

(72) Inventors: Bryce Anton, Longmont, CO (US); Vladimir Gorokhovsky, Lafayette, CO (US)

(73) Assignee: VAPOR TECHNOLOGIES, INC., Longmont, CO (US)

( * ) Notice: Subject to any disclaimer, the term of this patent is extended or adjusted under 35 U.S.C. 154(b) by 128 days.

This patent is subject to a terminal disclaimer.

(21) Appl. No.: 16/169,776

(22) Filed: Oct. 24, 2018

(65) Prior Publication Data
US 2020/0131620 A1    Apr. 30, 2020

(51) Int. Cl.
*C23C 14/22*    (2006.01)
*C23C 14/32*    (2006.01)
*H01J 37/32*    (2006.01)

(52) U.S. Cl.
CPC .......... *C23C 14/325* (2013.01); *C23C 14/228* (2013.01); *H01J 37/32055* (2013.01); *H01J 37/3266* (2013.01); *H01J 37/32614* (2013.01)

(58) Field of Classification Search
CPC .................................................. C23C 14/505
See application file for complete search history.

(56) References Cited

U.S. PATENT DOCUMENTS

| 9,412,569 | B2 | 8/2016 | Gorokhovsky et al. |
| 2004/0154919 | A1* | 8/2004 | Curtins ............... H01J 37/3266 |
| | | | 204/298.41 |
| 2005/0230387 | A1* | 10/2005 | Regan ..................... H05B 6/72 |
| | | | 219/761 |
| 2016/0326635 | A1* | 11/2016 | Gorokhovsky ......... C23C 14/54 |

FOREIGN PATENT DOCUMENTS

| AT | 392291 B | 2/1991 |
| EP | 0508612 A2 | 10/1992 |
| EP | 3091560 A1 | 11/2016 |

OTHER PUBLICATIONS

European Search Report dated Dec. 10, 2019 for EP Appn. No. 19182248.5 filed Jun. 25, 2019, 10 pgs.

* cited by examiner

*Primary Examiner* — Joseph A Miller, Jr.
(74) *Attorney, Agent, or Firm* — Brooks Kushman P.C.

(57) ABSTRACT

An arc coating system includes a coating chamber having a peripheral chamber wall, a top wall, and a bottom wall. The peripheral chamber wall, the top wall, and the bottom wall define a coating cavity and a chamber center. A plasma source is positioned at the chamber center wherein the plasma source comprises a central cathode rod and a plurality of cathode rods surrounding the central cathode rod. The coating system also includes a sample holder that holds a plurality of substrates to be coated. Characteristically, the sample holder rotatable about the chamber center at a first distance from the chamber center.

17 Claims, 6 Drawing Sheets

PVD SYSTEM WITH REMOTE ARC DISCHARGE PLASMA ASSISTED PROCESS

TECHNICAL FIELD

In at least on aspect, the present invention is directed to arc depositions systems and related methods.

BACKGROUND

Physical vapor deposition (PVD) and low pressure chemical vapor deposition (CVD) sources are used for deposition of coatings and surface treatment. Over the last 25 years, cathodic arc deposition (i.e., a type of physical deposition) has become established as a reliable source of highly ionized plasma for deposition of reacted as well as un-reacted coatings from conductive target materials such as zirconium, titanium, chrome, aluminum, copper and alloys thereof. The highly ionized plasma and the associated electron beam generated in the arc evaporation process is also used in such surface processing techniques as ion sputtering, etching, implantation and diffusion processes. In a typical cathodic arc coating process, an electric arc vaporizes material from a cathode target. The vaporized material then condenses on a substrate to form a coating.

Although cathodic arc systems work well, such systems are typically limited to only one or a few applications. Due the relatively high capital expenses for coating systems, and arc depositions in particular, there is desire for any given system for be capable of operating in a number of different applications. Such applications include sputtering only, cathodic arc deposition only, sputtering plus cathodic arc simultaneously, and the like.

Accordingly, there is a need for coating systems with improved versatility.

SUMMARY

The present invention solves one or more problems of the prior art by providing in at least one aspect, a coating system that includes a plurality of magnetrons surround a central cathode rod. The coating system includes a coating chamber having a peripheral chamber wall, a top wall, and a bottom wall. The peripheral chamber wall, the top wall, and the bottom wall define a coating cavity and a chamber center. A plasma source is positioned at the chamber center wherein the plasma source comprises a central cathode rod and a plurality of cathode rods surrounding the central cathode rod. The coating system also includes a sample holder that holds a plurality of substrates to be coated. Characteristically, the sample holder rotatable about the chamber center at a first distance from the chamber center.

In another embodiment, a coating system having external magnetic coils is provided. The coating system includes a coating chamber having a peripheral chamber wall, a top wall, and a bottom wall. The peripheral chamber wall, the top wall, and the bottom wall define a coating cavity and a chamber center. A plasma source is positioned at the chamber center wherein the plasma source comprises a central cathode rod. The coating system also includes a sample holder that holds a plurality of substrates to be coated. The sample holder is rotatable about the chamber center at a first distance from the chamber center. A first coaxial magnetic coil is positioned externally to the coating chamber and a second coaxial magnetic coil is positioned externally to the coating chamber.

Advantageously, the coating systems set forth above can be used for a number of difference applications. In one example, the coating system can be adapted for plasma enhanced magnetron sputtering accompanied by both ionization of metal-gaseous plasma by a remote arc discharge established between central cathode rid and the remote anode located by the peripheral chamber wall which is further enhanced by a hollow cathode plasma generating inside of the isolation shield. In another application, the coating system can be adapted for cathodic arc plasma deposition alone or in combination with magnetron sputtering enhanced by a densified hollow cathode plasma generating within the isolation shield. In another application, the coating system can be adapted for ion cleaning and ion surface conditioning in to hollow cathode gaseous plasma generating within a metal mesh negatively charged container. In still another application, the coating system can be adapted for plasma enhanced magnetron sputtering (PEMS).

DETAILED DESCRIPTION

Figure 1:
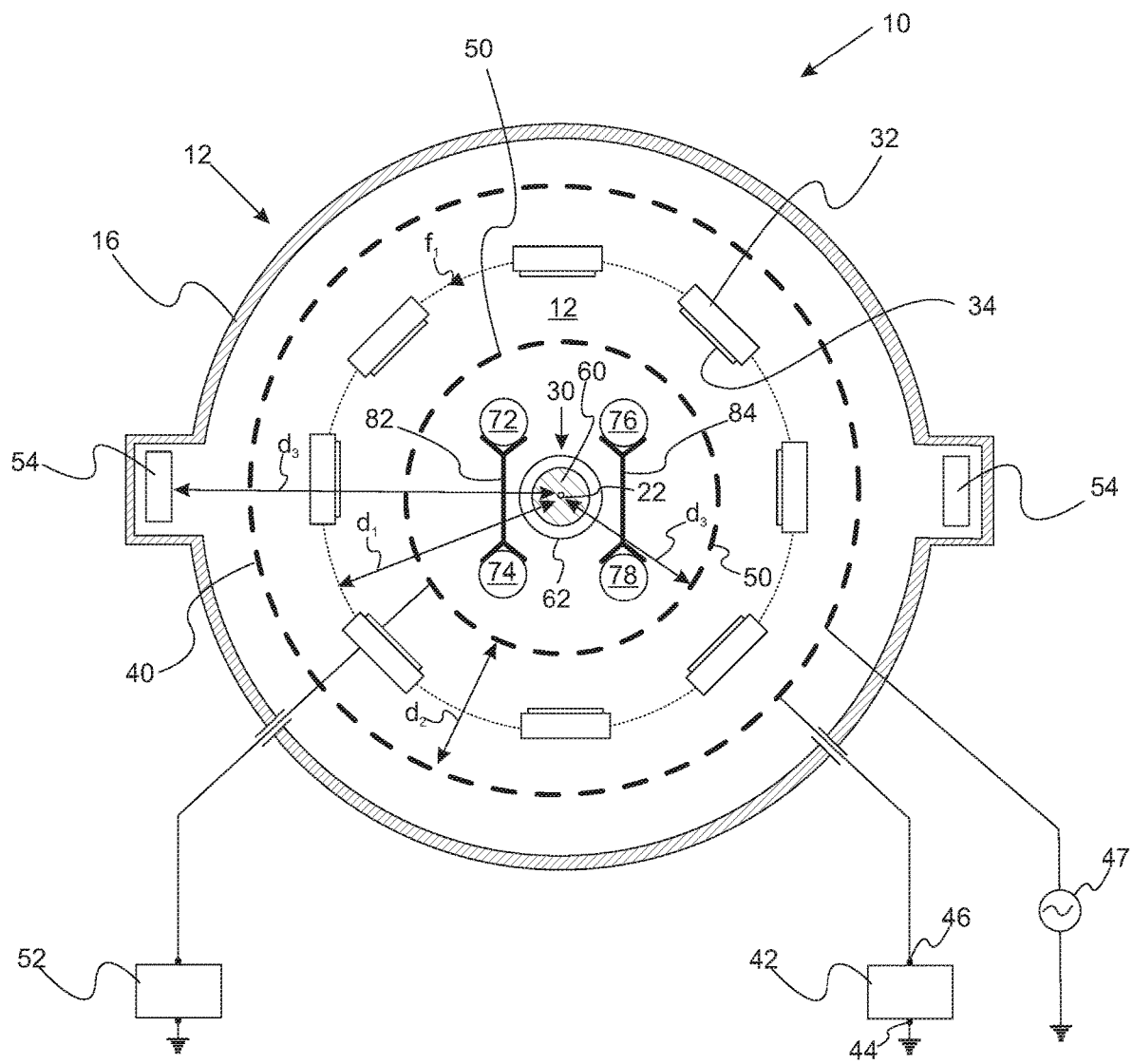
FIG. 1 is a schematic cross section and top view of a coating system including at least one isolation shield and a plurality of cathode rods.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

With reference to FIGS. 1, 2A, 2B, and 2C, schematic illustrations of coating systems having a plurality of cathode rods distributed about a central cathode is provided. Coating system 10 includes a coating chamber 12 defining a central coating cavity 14. In a refinement, coating chamber 12 includes peripheral chamber wall 16, top wall 18, and a bottom wall 20. In this context, "top" and "bottom" refer to the relative positions when the coating chamber is positioned in its design position, i.e., the orientation to be used for coating a substrate. Chamber center 22 is a position approximately at the center of the chamber with respect to peripheral wall 16. In a further refinement, peripheral chamber wall 16 is cylindrical with a circular cross section. Peripheral wall 16 includes top edge 24 and a bottom edge 26. Top wall 18 is adjacent to top edge 24 while bottom wall 20 is adjacent to bottom edge 26. In a refinement, the top wall 18 is a top flange positioned at top edge 24 of the peripheral chamber wall and bottom wall 20 is a bottom flange positioned at bottom edge 26 of the peripheral chamber wall. Plasma source 30 is positioned at the chamber center. Sample holder 32 holds a plurality of substrates 34 to be coated. Sample holder 32 is rotatable along direction $f_1$ about the chamber center at a first distance $d_1$ from the chamber center.

Figure 2A:
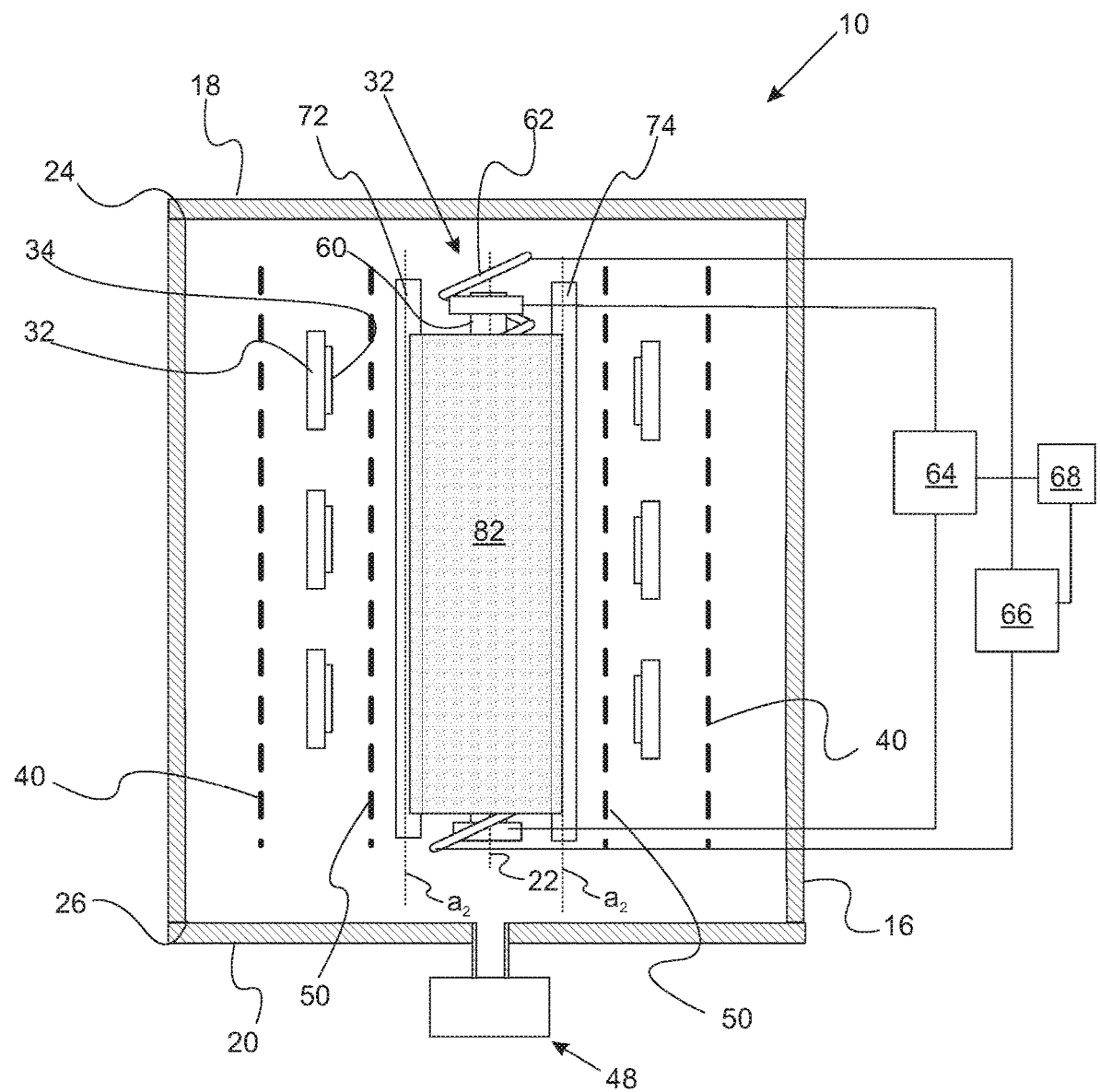
FIG. 2A is a schematic cross section and side view of a coating system including at least one isolation shield and a plurality of cathode rods.
Figure 2B:
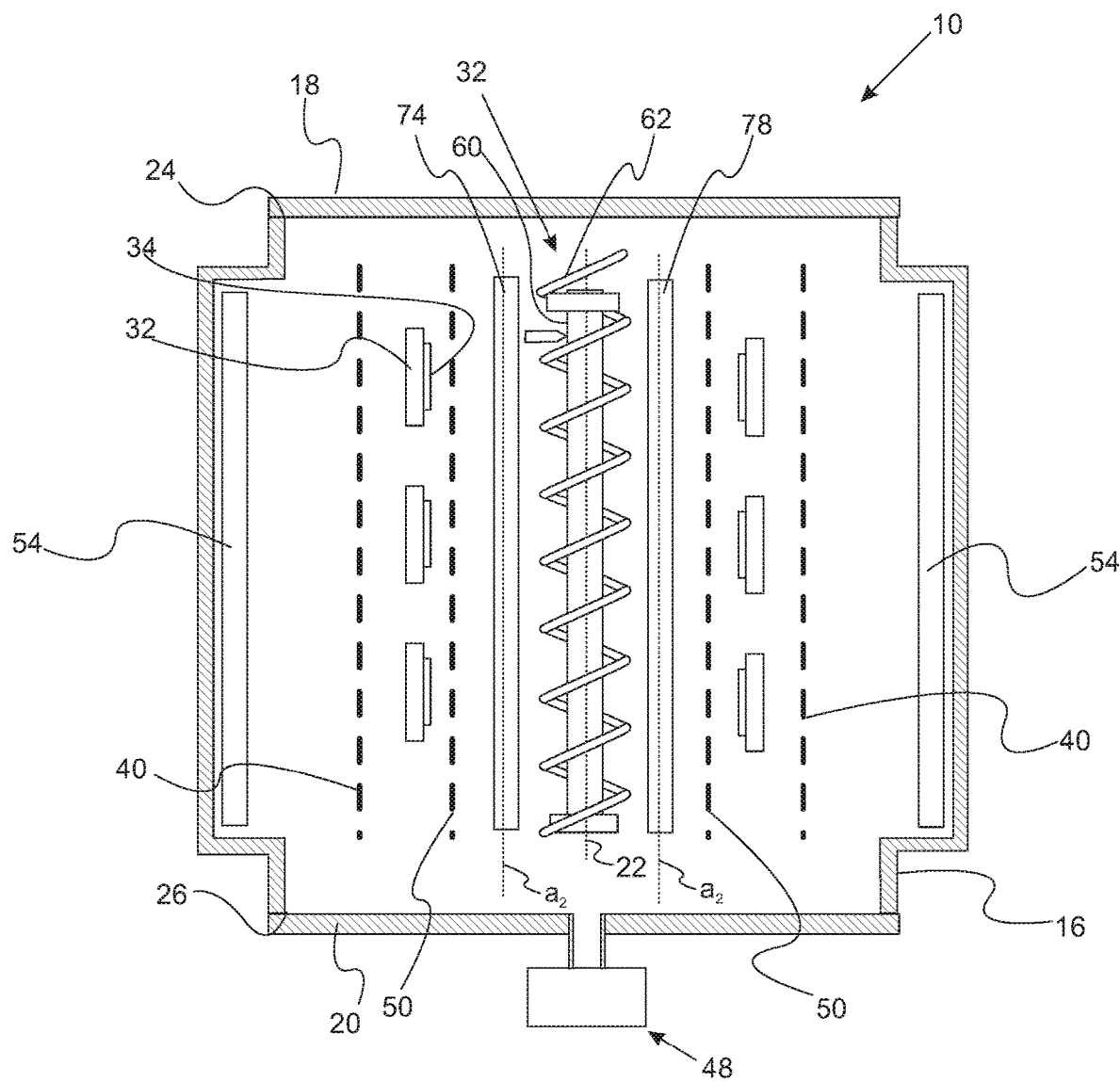
FIG. 2B is a schematic cross section and side view of a coating system including at least one isolation shield perpendicular to the view of FIG. 2A.

As depicted in FIGS. 2A and 2B, plasma source 30 can include central cathode rod 60 and central coil 62 surrounding central cathode rod 60. Central coil 62 is coaxially mounted about cathode rod 60. Cathode rod 60 is powered by power supply 64 while central coil 62 is powered by power supply 66. Control system 68 can be used to control the current flowing throw cathode rod 60 and central coil 62. Typically, the current flowing though is from 50 to 2000 A.

Still referring to FIGS. 1, 2A, 2B, and 2C, schematic illustrations of a coating system that includes a plurality of cathode sputtering rods distributed about a center cathode is provided. These rods can advantageously be used for as magnetrons for magnetron sputtering. In this variation, coating system 10 includes a plurality of cathode rods 72, 74, 76, and 78 surround plasma sources 30 (e.g., central cathode rod 60 and central coil 62). In a variation, the plurality of cathode rods includes 1 to 10 (e.g., 1, 2, 3, 4, 5, 6, 7, 8, 9, or 10) rod-shaped cathodes having a longitudinal axis $a_1$ aligned parallel to the peripheral chamber wall. In another refinement, the plurality of cathode rods includes an even number (e.g., 2, 4, 6, 8, etc.) of rod-shaped cathodes having a longitudinal axis $a_1$ aligned parallel to the peripheral chamber wall. FIG. 3 depicts a situation where there or 4 auxiliary cathode rods. Typically, each cathode rod of the plurality of cathode rods are rotatable about the longitudinal axis $a_2$. The adjacent rods can be rotated in the same sense or opposite sense (i.e., clockwise or counterclockwise). In a refinement, a plurality of blocking shields 82, 84 such that a blocking shield is positioned between alternating pairs of cathode rods in the plurality of cathode rods.

Figure 2C:
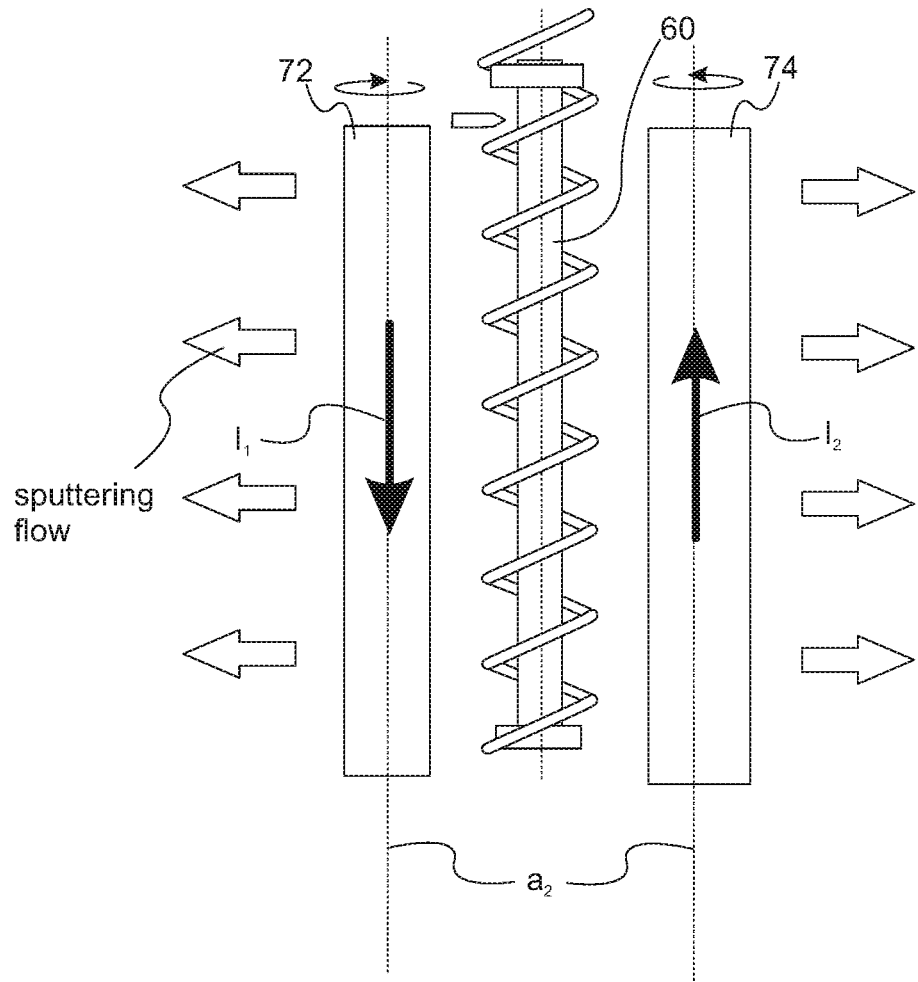
FIG. 2C is a schematic illustration the operation of the plurality of cathode rods during sputtering.
Figure 3:
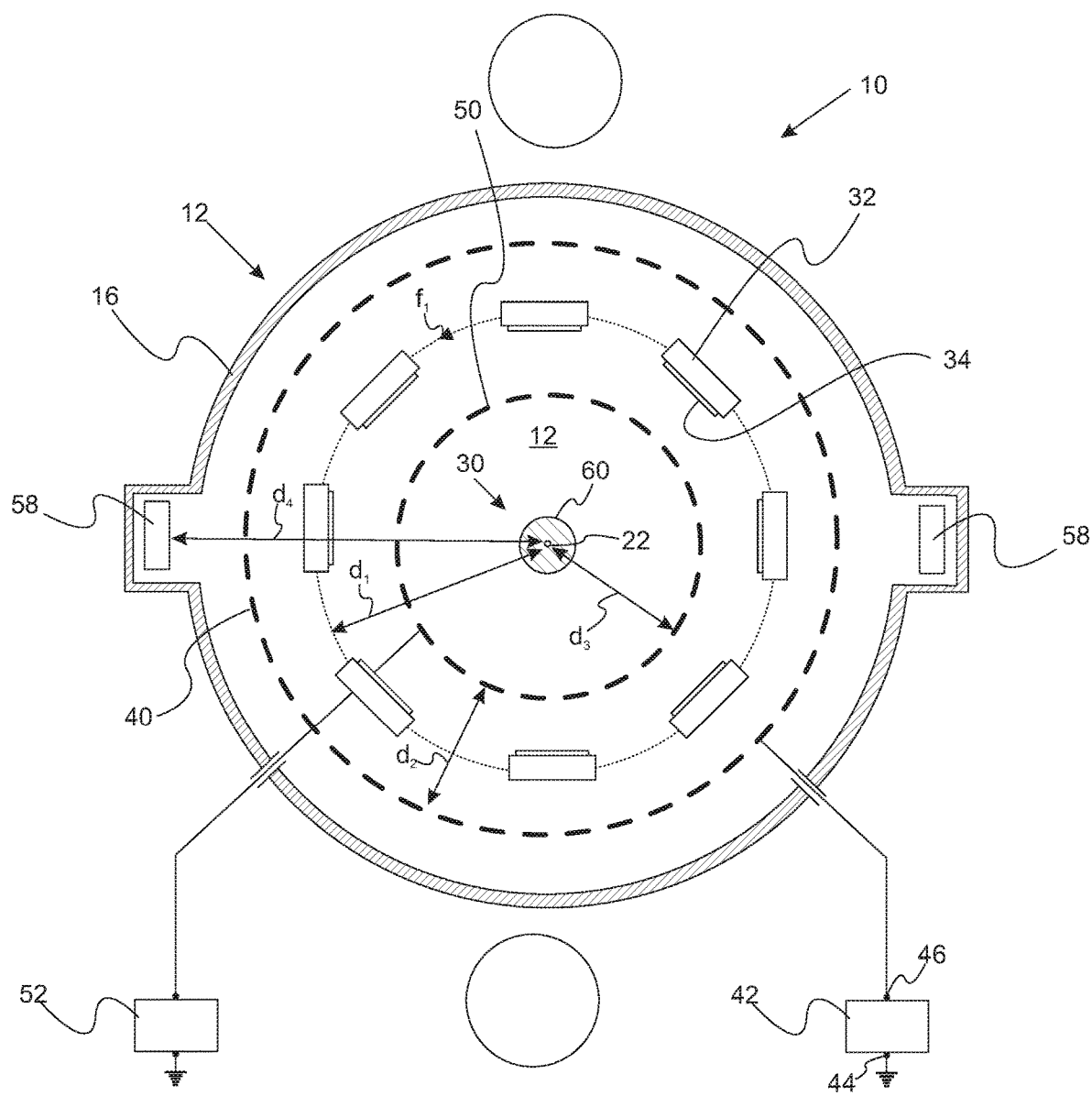
FIG. 3 is a schematic cross section and top view of a coating system with external magnetic coils.

As shown in FIG. 2C, the electric current can be conducted along the axis of the cylindrical magnetron sources with the currents along each neighbor pair of cathode rods directed in opposite directions $I_1$ and $I_2$. In this case, a focusing magnetic field will be generated by the linear currents conducted along the axes of the magnetrons, the magnetic field lines of this magnetic field lie in the plane perpendicular to the axes of the plasma sources focusing the metal vapor arc plasma through blocking shields 82, 84 away from the plasma source setup toward the substrates to be coated in the coating chamber. In this coating deposition, blocking shields 82, 84 are preferably position along the magnetic force lines generating by the linear currents conducted along the magnetron sputtering sources, which repels the positively charged ions away from the area between the baffles and the cathodic arc source toward the substrates to be coated in the deposition area of the coating chamber.

In a refinement, coating system 10 includes one or more isolation shields. First isolation shield 40 is positioned about the chamber center at a second distance $d_2$ from the chamber center. Typically, second distance $d_2$ is greater than the first distance. Alternatively, second distance is less than the first distance. The first isolation shield 40 is typically negatively charged. For this purpose, system 10 includes DC power supply 42 which has positive terminal 44 and negative terminal 46 which is connected to first isolation shield 40 or by connection to the RF power supply 47 in which case the negative auto polarization potential will create the RF hollow cathode effect inside of the hollow cathode container. Vacuum system 48 is in fluid communication with coating chamber 12 and is used to maintain a vacuum during coating deposition. In a variation described below in more detail, remote anodes 58 are positioned at a third distance $d_3$ from the chamber center moved away from the container established by first isolation shield 40.

First isolation shield 40 can establish a hollow cathode container enclosing both centrally located metal vapor plasma sources and substrates 34. It allows to increase the density and electron temperature as well as concentration of high energy electrons within the area inside of negatively charged first isolation shield 40 during all stages of the coating deposition process as compared to a system not having the isolation shield: (i) ion cleaning and ion surface condition stage in the hollow cathode gaseous plasma generating within the hollow cathode container; (ii) plasma enhanced magnetron sputtering (PEMS) mode when magnetron sputtering is providing win the hollow cathode plasma cloud generating by the hollow cathode container; (iii) the plasma enhanced magnetron sputtering accompanied by both ionization of the metal-gaseous plasma by the remote arc discharge established between the cylindrical cathode of the cathodic arc source and the remote anodes located by the chamber walls which is further enhanced by the hollow cathode plasma generating inside of the negatively charged metal container enclosing both centrally located plasma sources and substrates 34 in the coating deposition area; (iv) the cathodic arc plasma deposition mode along or in combination with magnetron sputtering enhanced by the densified hollow cathode plasma generating with the negatively charged hollow cathode container.

In a variation, coating system 10 further includes a second isolation shield 50. Second isolation shield 50 is positioned at a fourth distance $d_4$ from the chamber center that is less than the first distance $d_1$. In a further refinement, the substrates are biased at the same potential as second isolation shield 50. DC voltage supply 52 can be used for this purpose. In one refinement, first isolation shield 40 and second isolation shield 50 are each independently a metal mesh screen. Typically, first isolation shield 40 is outer metal mesh screen and second isolation shield 50 is an inner metal mesh screen. Typically, the outer mesh screen and the inner mesh screen have openings that are each independently from 1 mm to 50 mm. In a refinement, the outer mesh screen and the inner mesh screen have openings that are each independently from 5 mm to 20 mm. wherein substrates to be coated are enclosed in a container established by the first isolation shield separating the substrates from the peripheral chamber wall and the second isolation shield separating substrates from a central cathode rod. The openings smaller than 1 mm can block plasma from flowing across the metal mesh wall, while the opening greater than 50 mm can mitigate the production of dense plasma by the hollow cathode effect.

When second isolation shield 50 is present, the substrates 34 are enclosed in the negatively DC pulsed powered metal mesh container established between the first isolation shield (e.g., an outer mesh screen) separating the substrates 34 from peripheral wall 16 and second isolation shield 50 (e.g., inner metal mesh screen) separating substrates 34 from the centrally positioned plasma sources. The substrates can be bias to the same potential as first isolation shield 40 and/or second isolation shield 50 by simply electrically connecting them to the metal mesh screen, or, alternatively, the bias potential of the substrates 34 can be different from the potential of the metal mesh screen container, which can be provided by the independent substrate bias power supply (not shown).

In a variation, first isolation shield 40 does not have to provide complete separation of the inside area from the grounded chamber walls. For instance, the top and the bottom of the container can be completely or partially opened to the chamber with the isolation shield removed. Alternatively, first isolation shield 40 and/or second isolation shield 50 can partially can be made of the metal sheet without openings. For instance, the top and the bottom walls of the metal mesh container can be made of metal sheet without openings or can be open to the chamber walls.

In another refinement as depicted in FIGS. 3A and 3B, one or both of first isolation shield 40 and second isolation shield 50 include a plurality of parallel rods typically with a distance $d_r$ between neighbor rods 54 from 1 mm to 50 mm. Crossbars 56 can be used to hold rods 54 about chamber center 22.

As set forth above, coating system 10 can further includes remote anode 58 which can be positioned at a fourth distance $d_4$ from the chamber center that is greater than the first distance $d_1$ and the second distance $d_2$. In a refinement, system 10 further includes one or more additional remote anodes 54 distributed along peripheral wall 16. Peripheral wall 16 can optionally include recesses 60 for positions such remote anode. The presence of a remote anode allows the coating system to be operated in a remote arc assisted magnetron sputtering (RAAMS) mode as set forth in U.S. Pat. No. 9,412,569; the entire disclosure of which is hereby incorporated by reference.

Figure 4A:
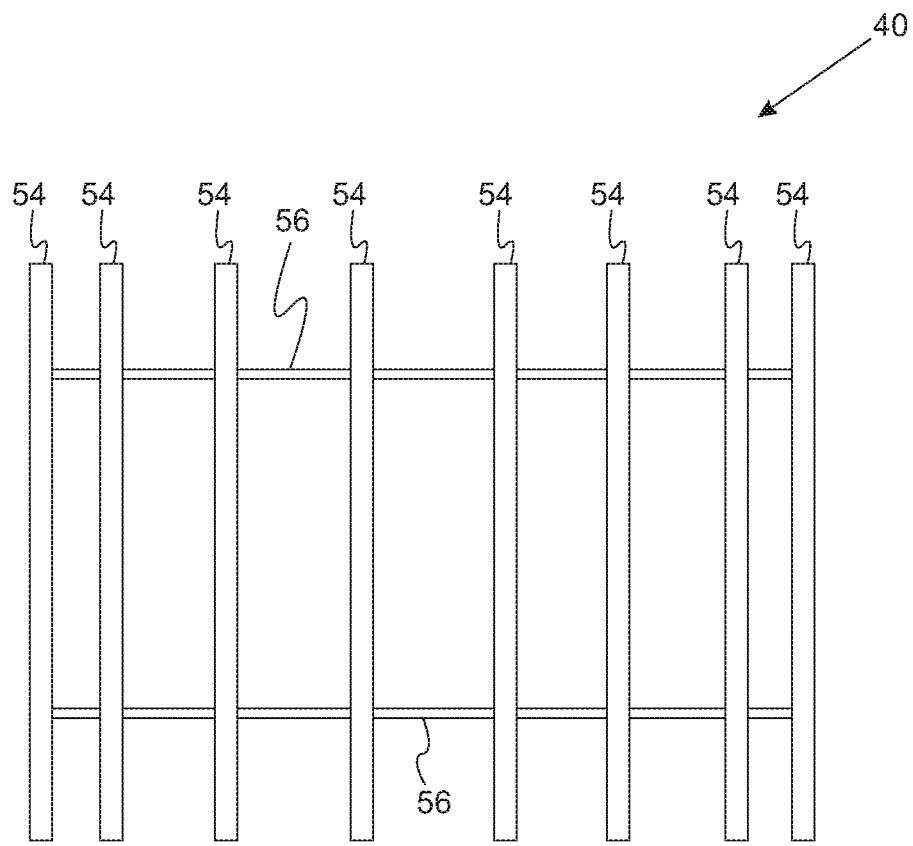
FIG. 4A is a side view of an isolation shield formed from parallel rods.
Figure 4B:
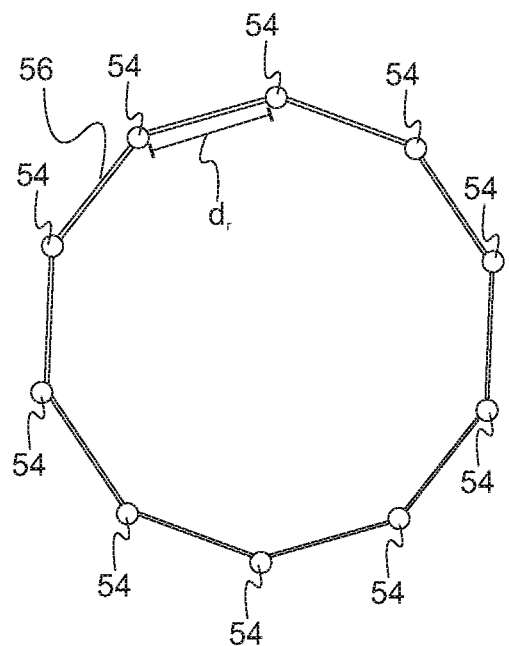
FIG. 4B is a side view of an isolation shield formed from parallel rods.

With reference to FIG. 4, a schematic illustration of a coating system having external coaxial magnetic coils is provided. In this variation, the central coil 62 which is placed in the cavity of coating chamber 12 depicted in FIGS. 2A and 2B is absent. Instead, coaxial magnetic coils are placed external to coating chamber 12 but proximate to peripheral wall 16. For example, FIG. 5 shows first coaxial magnetic coil 90 positioned proximate to the first wall external to the coating chamber and second coaxial magnetic coil 92 positioned proximate to the second wall external to the coating chamber.

The following examples illustrate the various embodiments of the present invention. Those skilled in the art will recognize many variations that are within the spirit of the present invention and scope of the claims.

Example 1. RAAMS Deposition of TiN Coatings

The coating system shown in FIG. 1 equipped with 4 cylindrical magnetrons and centrally located cylindrical cathodic arc source is used for this coating deposition process. Both the magnetrons and the cathodic arc source are equipped with titanium targets. At the beginning stage of ion cleaning the argon as plasma created gas is introduced into the vacuum chamber to gas pressure ranging from 1 to 10 mTorr. The primary arc discharge is ignited by mechanical trigger between the surface of the cathodic arc target and grounded shields positioned between the magnetron sources. The remote arc discharge is then ignited between the cylindrical cathode target and remote anodes located by the walls of the vacuum coating deposition chamber. The current of the primary arc is set at 140 A while its voltage is oscillating within the range from approximately 25V to approximately 30V. The current of the remote arc is set at 400 A while its voltage is oscillating within the range from approximately 60V to approximately 80V. The current of the remote arc propagates from the cathode target throughout the chevron shield, which is not transparent for the heavy components of the vacuum arc plasma (metal ions, atoms and macroparticles) while allows the electron current of the remote arc discharge to be conducted from the cylindrical cathode target toward the remote anodes located by the coating chamber walls. The substrates to be coated are loaded on the rotary table, which allow them to rotate around the center of the coating chamber and, at the same time, around their own axes. The bias voltage of −300V is applied to the rotary table with substrates to be coated. The ion cleaning stage continuous for 30 min followed by remote arc assisted magnetron sputtering (RAAMS) deposition stage. At the beginning of the deposition stage the nitrogen is added to the chamber to make about 30% N2/balance argon mixture at the pressures ranging from 2 to 5 mTorr. The magnetrons are turned on by magnetron power supplies with power density approximately 5 W/cm2 of the magnetron sputtering target. The substrate bias during TiN coating deposition stage is reduced to 100V. The deposition of TiN coating is lasting 3 hrs. for deposition of 5 µm thick TiN coating.

Example 2. RAAMS Deposition of TiN/DLC 2-Segment Coatings

The coating system shown in FIG. 1 equipped with 4 cylindrical magnetrons and centrally located cylindrical cathodic arc source is used for this coating deposition process. Both the magnetrons and the cathodic arc source are equipped with titanium targets. The metal mesh cage is electrically connected to the rotary table with substrates to be coated to maintain equal potential of the cage and substrates. The cage and rotary table are connected to DC bias power supply and high voltage DC pulse power supply via switches so either of these two power supplies can be connected to the metal cage and rotary table with substrates to be coated at different stages of the coating deposition process. At the beginning stage of ion cleaning the argon as plasma created gas is introduced into the vacuum chamber to gas pressure ranging from 1 to 10 mTorr. The primary arc discharge is ignited by mechanical trigger between the surface of the cathodic arc target and grounded shields positioned between the magnetron sources. The remote arc discharge is then ignited between the cylindrical cathode target and remote anodes located by the walls of the vacuum coating deposition chamber. The current of the primary arc is set at 140 A while its voltage is oscillating within the range from approximately 25V to approximately 30V. The current of the remote arc is set at 400 A while its voltage is oscillating within the range from approximately 60V to approximately 80V. The current of the remote arc is propagating from the cathode target throughout the chevron shield, which is not transparent for the heavy components of the vacuum arc plasma (metal ions, atoms and macroparticles) while allows the electron current of the remote arc discharge to be conducted from the cylindrical cathode target toward the remote anodes located by the coating chamber walls. The substrates to be coated are loaded on the rotary table, which allow them to rotate around the center of the coating chamber and, at the same time, around their own axes. The DC pulse power supply is disconnected from the cage and DC bias power supply is connected to the cage to apply DC bias voltage of −300V to the rotary table with substrates to be coated during ion cleaning stage. The ion cleaning stage continuous for 30 min followed by remote arc assisted magnetron sputtering (RAAMS) deposition stage. At the beginning of the deposition stage the nitrogen is added to the chamber to make about 30% N2/balance argon mixture at the pressures ranging from 2 to 5 mTorr. The magnetrons are turned on by magnetron power supplies with power density approximately 5 W/cm2 of the magnetron sputtering target. The substrate bias during TiN coating deposition stage is reduced to 100V DC. The deposition of TiN coating is lasting 1 hrs. for deposition of 1.5 μm thick TiN coating segment. After completing the TiN coating segment deposition stage, the magnetrons are turned off and argon/nitrogen mixture as reactive gas atmosphere is replaced with acetylene to total pressure of 15 mTorr. The DC bias power supply is disconnected from the cage and DC pulse bias power supply is connected to the cage and simultaneously to the rotary table with substrates to be coated. The negative DC pulse voltage with −5 kV amplitude and 30 kHz frequency is applied to the cage and rotary table to establish the hollow cathode enhanced dense plasma cloud during deposition of the top DLC coating segment. The deposition of the DLC segment is lasting 4 hrs. resulting in deposition of 5 μm thick DLC top segment layer.

Example 3. RAAMS-Cathodic Arc Hybrid Deposition of TiSiNC Nanocomposite Coatings The coating system shown in FIG. 1 equipped with 4 cylindrical magnetrons and centrally located cylindrical cathodic arc source is used for this coating deposition process. Both the magnetrons and the cathodic arc source are equipped with titanium targets same as in Example 1. The adjustable venetian baffles are used between two magnetrons of two opposite pairs of magnetrons, while between magnetrons of adjacent pairs of magnetrons the solid metal shield is installed as shown in FIG. 1. At the beginning stage of ion cleaning the argon as plasma created gas is introduced into the vacuum chamber to gas pressure ranging from 1 to 10 mTorr. The primary arc discharge is ignited by mechanical trigger between the surface of the cathodic arc target and grounded shields positioned between the magnetron sources. At the stage of ion cleaning the venetian baffles are slightly open blocking the heavy components of the cathodic arc from propagating into the coating deposition area between centrally located plasma sources and the chamber walls while allow the electron current to freely propagate through the array of the venetian baffles along the remote arc discharge established between the cylindrical cathode target and the remote anodes positioned by the chamber's walls. The remote arc discharge is then ignited between the cylindrical cathode target and remote anodes located by the walls of the vacuum coating deposition chamber. The current of the primary arc is set at 140 A while its voltage is oscillating within the range from approximately 25V to approximately 30V. The current of the remote arc is set at 400 A while its voltage is oscillating within the range from approximately 60V to approximately 80V. The substrates to be coated are loaded on the rotary table, which allow them to rotate around the center of the coating chamber and, at the same time, around their own axes. The bias voltage of −300V is applied to the rotary table with substrates to be coated and, simultaneously to the metal mesh cage electrically connected to the rotary table by the DC bias power supply, which is switched on, while the high voltage DC pulse power supply is switched off. The ion cleaning stage continuous for 30 min followed by remote arc assisted magnetron sputtering (RAAMS) deposition stage. At the beginning of the TiNSiC nanocomposite coating deposition stage the nitrogen and trimethylsilane (3MS) are added to the argon in the processing chamber to make the reactive gas mixture of the 30% N2/10%3MS/balance argon composition at the pressures ranging from 2 to 5 mTorr. The magnetrons are turned on by magnetron power supplies with power density approximately 5 W/cm2 of the magnetron sputtering target. The DC bias power supply is switched off while the high voltage DC pulse power supply is switched on and set to apply 5 kV negative pulses with 30 kHz repetition frequency. The electric current of about 300 A is conducted along the cylindrical magnetron, having its directions switched to the opposite in each neighbor magnetron as shown in FIGS. 15*j* and 15*k* to provide focusing magnetic field between the neighbor magnetrons as illustrated by magnetic force lines with arrows in FIGS. 15*i* and 15*k*. The position of the strips of the venetian baffles are adjusted to make the surface of the baffles generally tangential to the focusing magnetic field as shown in FIG. 15*k*, creating the plasma transporting corridors between the neighbor strips of the venetian baffles array. The directions of the magnetron sputtering metal atoms flow and the magnetically focusing cathodic arc metal vapor plasma are coincided to provide cathodic arc/magnetron hybrid process of deposition of nanocomposite TiNSiC coating, which is lasting 5 hrs. for deposition of 20 μm thick TiNSiC nanocomposite coating.

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A coating system comprising:
 a coating chamber having a peripheral chamber wall, a top wall, and a bottom wall, the peripheral chamber wall, the top wall, and the bottom wall defining a coating cavity and a chamber center;
 a plasma source positioned at the chamber center wherein the plasma source comprises a central cathode rod and a plurality of cathode rods surrounding the central cathode rod, each a longitudinal axis aligned parallel to the peripheral chamber wall; and
 a sample holder that holds a plurality of substrates to be coated, the sample holder rotatable about the chamber center at a first distance from the chamber center, wherein each cathode rod in the plurality of cathode rods are rotatable about the longitudinal axis.

2. The coating system of claim 1 further comprising a central coil surrounding the central cathode rod.

3. The coating system of claim 1 further comprising at least one remote anode positioned at a second distance from the chamber center proximate to the peripheral chamber wall.

4. The coating system of claim 1 wherein the plurality of cathode rods includes 1 to 10 rod-shaped cathodes.

5. The coating system of claim 1 further comprising a plurality of blocking shields such that a blocking shield is positioned between alternating pairs of cathode rods in the plurality of cathode rods.

6. The coating system of claim 1 further comprising a first isolation shield interposed between the sample holder and the peripheral chamber wall and a second isolation shield interposed between the plasma source and the sample holder.

7. The coating system of claim 6 wherein the first isolation shield is an outer metal mesh screen and the second isolation shield is an inner metal mesh screen.

8. The coating system of claim 7 wherein substrates are biased to a same potential as the inner metal mesh screen.

9. The coating system of claim 8 further comprising a DC power supply having a positive terminal and a negative terminal, the negative terminal being connected to the first isolation shield.

10. The coating system of claim 1 wherein the top wall is a top flange positioned at a top edge of the peripheral chamber wall and the bottom wall is a bottom flange positioned at a bottom edge of the peripheral chamber wall.

11. A coating system comprising:
 a coating chamber having a peripheral chamber wall, a top wall, and a bottom wall, peripheral chamber wall, the top wall, and the bottom wall define a coating cavity and a chamber center;
 a plasma source positioned at the chamber center wherein the plasma source comprises a central cathode rod and a plurality of cathode rods surrounding the central cathode rod;
 a sample holder that holds a plurality of substrates to be coated, the sample holder rotatable about the chamber center at a first distance from the chamber center; and
 a first coaxial magnetic coil positioned externally to the coating chamber and a second coaxial magnetic coil positioned externally to the coating chamber, wherein each cathode rod in the plurality of cathode rods are rotatable about a longitudinal axis.

12. The coating system of claim 11 wherein the first coaxial magnetic coil is positioned proximate to the peripheral chamber wall and the second coaxial magnetic coil is positioned proximate to the peripheral chamber wall.

13. The coating system of claim 11 further comprising a central coil surrounding the central cathode rod.

14. The coating system of claim 11 further comprising at least one remote anode positioned at a second distance from the chamber center proximate to the peripheral chamber wall.

15. The coating system of claim 1 further comprising a plurality of blocking shields such that a blocking shield is positioned between alternating pairs of cathode rods in the plurality of cathode rods.

16. The coating system of claim 11 further comprising a first isolation shield interposed between the sample holder and the peripheral chamber wall and a second isolation shield interposed between the plasma source and the sample holder.

17. The coating system of claim 16 wherein the first isolation shield is an outer metal mesh screen and the second isolation shield is an inner metal mesh screen.

* * * * *